United States Patent
Ding et al.

(10) Patent No.: US 10,937,843 B2
(45) Date of Patent: Mar. 2, 2021

(54) DISPLAY PANEL AND DISPLAY APPARATUS

(71) Applicant: Shanghai Tianma Micro-Electronics Co., Ltd., Shanghai (CN)

(72) Inventors: Hong Ding, Shanghai (CN); Qijun Yao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/688,355

(22) Filed: Nov. 19, 2019

(65) Prior Publication Data
US 2020/0273919 A1 Aug. 27, 2020

(30) Foreign Application Priority Data
Feb. 26, 2019 (CN) .......................... 201910141259.0

(51) Int. Cl.
*G06F 3/044* (2006.01)
*H01L 27/32* (2006.01)
(Continued)

(52) U.S. Cl.
CPC .......... *H01L 27/323* (2013.01); *G06F 3/0412* (2013.01); *G06F 3/0446* (2019.05);
(Continued)

(58) Field of Classification Search
CPC ............. G02F 1/1309; G02F 1/136286; G02F 2001/136254; G09G 3/006; G09G 2300/0426; G09G 2203/04111; G09G 2203/04112; H01L 27/3276; H01L 51/0031; H01L 27/124; H01L 27/1255; H01L 27/323; H01L 27/3265;
(Continued)

(56) References Cited

U.S. PATENT DOCUMENTS

| 10,235,954 B2* | 3/2019 | Haga ........................ G09G 3/18 |
| 2010/0013853 A1* | 1/2010 | Takatori ............ G02F 1/134336 |
| | | 345/611 |

(Continued)

FOREIGN PATENT DOCUMENTS

| CN | 108153017 A | 6/2018 |
| CN | 108172593 A | 6/2018 |
| WO | 2017221844 A1 | 12/2017 |

*Primary Examiner* — Amr A Awad
*Assistant Examiner* — Aaron Midkiff
(74) *Attorney, Agent, or Firm* — Anova Law Group PLLC

(57) ABSTRACT

A display panel and a display apparatus are provided. The display panel includes a display area, a bezel area and a hole area. The bezel area includes an inner bezel area surrounding the hole area and an outer bezel area surrounding the display area, and the display area surrounds the hole area and is disposed between the inner bezel area and the outer bezel area. The display panel also includes a substrate layer, a light-emitting layer, an encapsulation layer and a touch layer that are sequentially stacked; at least two detection soldering pads disposed in the outer bezel area; and a detection line including at least one first detection segment disposed in the inner bezel area, at least two second detection segments disposed in the display area and at least two third detection segments in outer bezel area.

15 Claims, 13 Drawing Sheets

(51) Int. Cl.
  *H01L 51/52* (2006.01)
  *G06F 3/041* (2006.01)
  *H01L 27/12* (2006.01)
(52) U.S. Cl.
  CPC ...... *H01L 27/3265* (2013.01); *H01L 27/3276* (2013.01); *H01L 51/524* (2013.01); *H01L 51/5253* (2013.01); *G06F 2203/04111* (2013.01); *G06F 2203/04112* (2013.01); *H01L 27/124* (2013.01); *H01L 27/1255* (2013.01)
(58) Field of Classification Search
  CPC . H01L 51/5253; H01L 51/524; G06F 3/0412; G06F 3/044–0448; G06F 2203/04111; G06F 2203/04112
  USPC .............................. 178/18.06; 345/173, 174
  See application file for complete search history.

(56) References Cited

U.S. PATENT DOCUMENTS

| | | | |
|---|---|---|---|
| 2014/0176844 A1* | 6/2014 | Yanagisawa | G09G 3/006 349/43 |
| 2016/0011633 A1* | 1/2016 | Watanabe | G06F 1/1637 345/184 |
| 2018/0158741 A1* | 6/2018 | Kim | H01L 22/12 |
| 2018/0158894 A1* | 6/2018 | Park | H01L 51/5253 |
| 2018/0166525 A1* | 6/2018 | Kim | H01L 51/0031 |
| 2019/0064960 A1* | 2/2019 | Na | G06F 3/044 |
| 2019/0196661 A1* | 6/2019 | Baek | G09G 3/3225 |

\* cited by examiner

DISPLAY PANEL AND DISPLAY APPARATUS

CROSS-REFERENCES TO RELATED APPLICATIONS

This application claims priority of Chinese Patent Application No. 201910141259.0, filed on Feb. 26, 2019, the entire contents of which are hereby incorporated by reference.

FIELD OF THE DISCLOSURE

The present disclosure generally relates to the field of display technology and, more particularly, relates to a display panel and a display apparatus.

BACKGROUND

Electronic devices with display panels have been widely used nowadays. To meet users' requirements for the display area, electronic devices, such as mobile terminal products, the bezel size of the display panel has been continuously reduced to pursue a high screen ratio. Accordingly, the irregularly-shaped display panels have been designed. For example, a hole is drilled in the display panel to place a device, such as a camera which is originally located in the bezel area, into the hole to achieve the purpose of compressing the bezel size. However, when the hole is drilled in the display panel, a drilling crack(s) may occur at the edge of the hole, and the propagation of the crack to the display area may affect the display performance of the display panel.

Therefore, there is a need to detect the crack(s) at the edge of the hole in the irregularly-shaped display panel. The disclosed display panel and display apparatus are directed to solve one or more problems set forth above and other problems in the art.

BRIEF SUMMARY OF THE DISCLOSURE

One aspect of the present disclosure provides a display panel. The display panel may include a display area, a bezel area, and a hole area. The bezel area may include an inner bezel area surrounding the hole area and an outer bezel area surrounding the display area, and the display area may surround the hole area and may be disposed between the inner bezel area and the outer bezel area. The display panel may also include a substrate layer, a light-emitting layer, an encapsulation layer and a touch layer, that are sequentially stacked; at least two detection soldering pads disposed in the outer bezel area; and a detection line, including at least one first detection segment disposed in the inner bezel area, at least two second detection segments disposed in the display area and at least two third detection segments in outer bezel area. The at least one first detection segment may extend along a direction surrounding the hole area; two ends of a first detection segment of the at least one first detection segment may be respectively connected to two different second detection segments of the at least two second detection segments; a third detection segment of the at least two third detection segments may be connected between a second detection segment of the at least two second detection segments and a detection soldering pad of the at least two detection soldering pads; and at least the at least two second detection segments may be disposed on the touch layer.

Another aspect of the present disclosure provides a display apparatus. The display apparatus may include a case and a display panel.

The display panel may include a display area, a bezel area, and a hole area. The bezel area may include an inner bezel area surrounding the hole area and an outer bezel area surrounding the display area, and the display area may surround the hole area and may be disposed between the inner bezel area and the outer bezel area. The display panel may also include a substrate layer, a light-emitting layer, an encapsulation layer and a touch layer, that are sequentially stacked; at least two detection soldering pads disposed in the outer bezel area; and a detection line, including at least one first detection segment disposed in the inner bezel area, at least two second detection segments disposed in the display area and at least two third detection segments in outer bezel area. The at least one first detection segment may extend along a direction surrounding the hole area; two ends of a first detection segment of the at least one first detection segment may be respectively connected to two different second detection segments of the at least two second detection segments; a third detection segment of the at least two third detection segments may be connected between a second detection segment of the at least two second detection segments and a detection soldering pad of the at least two detection soldering pads; and at least the at least two second detection segments may be disposed on the touch layer.

Other aspects of the present disclosure can be understood by those skilled in the art in light of the description, the claims, and the drawings of the present disclosure.

BRIEF DESCRIPTION OF THE DRAWINGS

The following drawings are incorporated in and constitute a part of the specification, illustrating embodiments of the present disclosure, and together with the detailed descriptions serve to explain the mechanism of the present disclosure.

DETAILED DESCRIPTION

Figure 1:
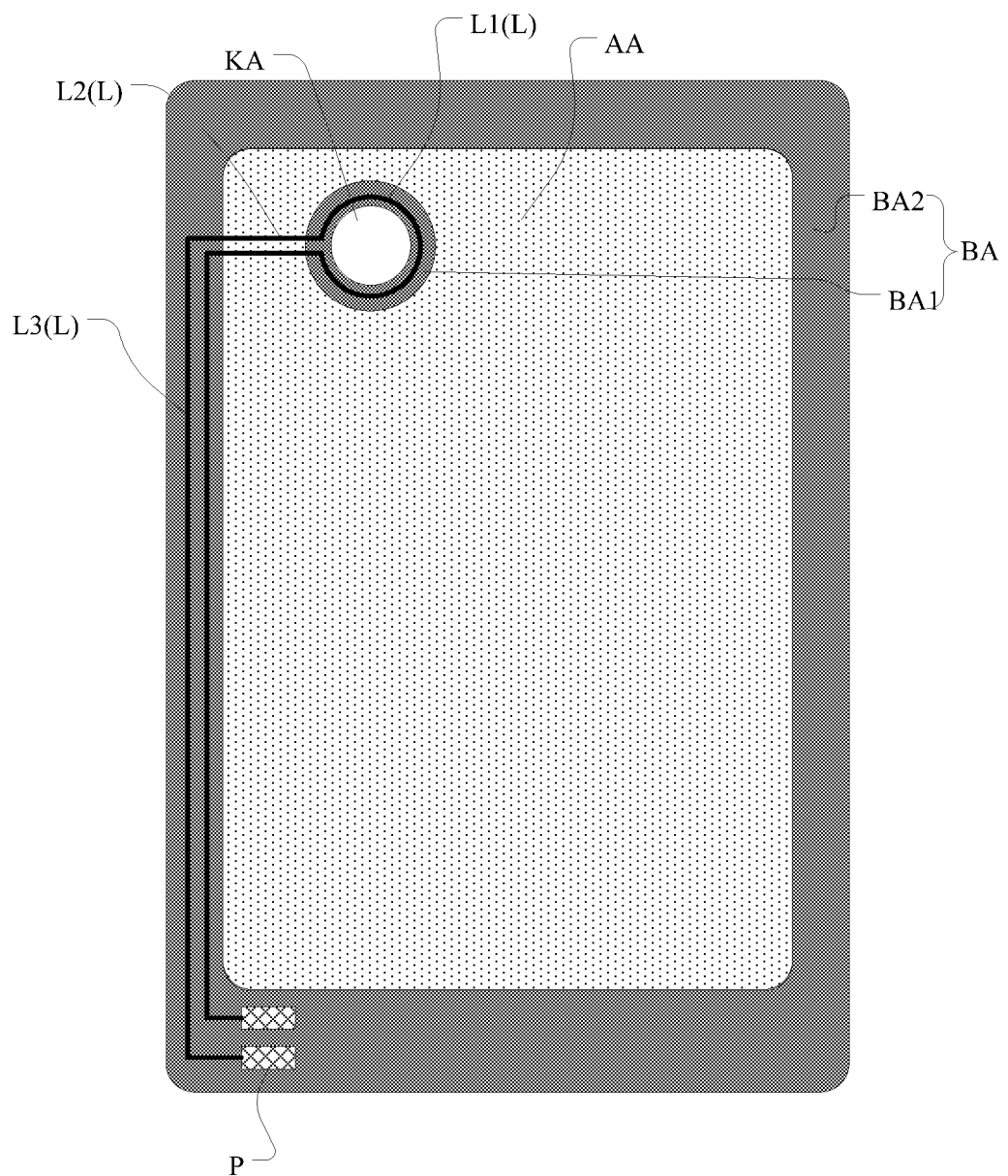
FIG. 1 illustrates a top view of an exemplary display panel consistent with various disclosed embodiments of the present disclosure.

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined when there are no conflicts.

Certain techniques, methods, and apparatus that are understandable to the persons of ordinary skill in the art may not be described in detail. However, under appropriate conditions, such techniques, methods and apparatus are also included as the parts of the description.

In the disclosed embodiments, specific values may be explained for illustrative purposes and might not be used as limitations. Thus, embodiments may have different specific values.

Further, the similar symbols and letters in the drawings may denote similar elements. Thus, once one element is defined in one drawing, it may not need to be defined in the following drawings.

Figure 2:
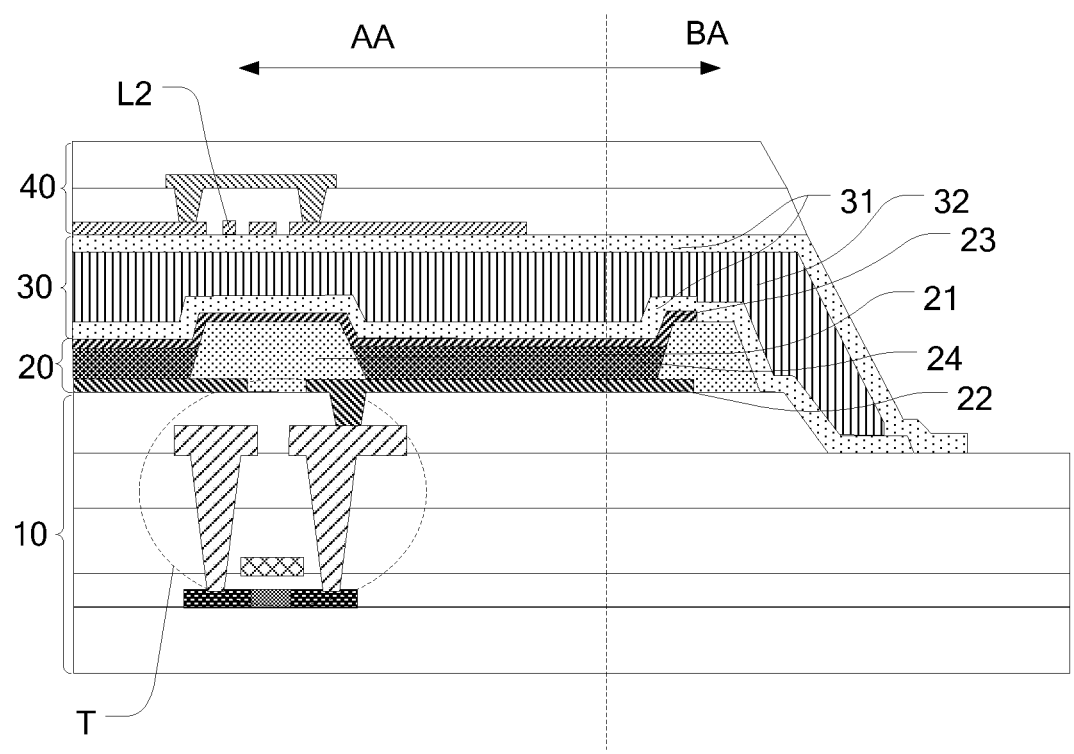
FIG. 2 illustrates a layer structure of an exemplary display panel consistent with various disclosed embodiments of the present disclosure.

FIG. 1 illustrates a top view of an exemplary display panel consistent with various disclosed embodiments of the present disclosure. FIG. 2 illustrates a layer structure of an exemplary display panel consistent with various disclosed embodiments of the present disclosure.

As shown in FIG. 1, in one embodiment, the display panel may include a display area AA, a bezel area BA, and a hole area KA. The bezel area BA may include an inner bezel area BA1 surrounding the hole area KA, and an outer bezel area BA2 surrounding the display area AA. The display area AA may surround the hole area KA; and may be located between the inner bezel area BA1 and the outer bezel area BA2. The hole area KA may be set as a holding space for a module, such as a camera, or a sensor, etc., in the display apparatus. In the manufacturing process, a predetermined position of the display panel may be drilled to form the hole area KA.

The display panel may also include detection soldering pads P and a detection line L. At least two detection pads P may be disposed in the outer bezel area BA2. The detection line L may include at least one first detection segment L1 disposed in the inner bezel area BA1, at least two second detection segments L2 disposed in the display area AA, and at least two third detection segments L3 disposed in the outer bezel area BA2. The first detection segment L1 may extend along the direction surrounding the hole area KA, and two ends of the first detection segment L1 may be respectively connected to two different second detection segments L2. A third detection segment L3 may be connected to a second detection segment L2 of the at least two second detection segments and a detection soldering pad P of the at least two detection soldering pads L. Each of the at least two third detection segments L3 may be connected to one of the at least two detection soldering pads P.

As shown in FIG. 2, the display panel may include sequentially stacked a substrate layer 10, a light-emitting layer 20, an encapsulation layer 30, and a touch layer 40. The substrate layer 10 may include a substrate and a pixel circuit disposed between the substrate and the light-emitting layer 20. The pixel circuit may include a plurality of thin film transistors T. The light-emitting layer 20 may include a pixel defining layer 21 and an organic light-emitting device. The organic light-emitting device may include an anode 22, a cathode 23, and an organic light-emitting material layer 24 between the anode 22 and the cathode 23. The encapsulation layer 30 may include a thin film encapsulation structure formed by alternately stacking a plurality of inorganic layers and organic layers to encapsulate the organic light-emitting material.

Further, as shown in FIG. 2, the encapsulation layer 30 may include two inorganic layers 31 and one organic layer 32. The touch layer 40 may be disposed on the side of the encapsulation layer 30 away from the light-emitting layer 20. The encapsulation layer 30 may be used as a carrier substrate; and the touch layer 40 may be directly formed on the encapsulation layer 30. Therefore, it may not require forming an extra touch layer and then attach the extra touch layer to the display panel. In particular, the touch layer 40 may be integrated in the display panel. The touch layer 40 may include a sensing electrode and a driving electrode disposed vertically in a crossover manner. In particular, the sensing electrode and the driving electrode may be stripe electrodes respectively or may also be block electrodes including a plurality of electrode blocks respectively. The sensing electrode and the driving electrode may be formed by a thin film conductive material or a metal material. The specific structure and the material of the touch layer 40 are not limited in the present disclosure.

At least the second detection segments L2 may be disposed on the touch layer 40. The first detection segment L1 and the third detection segments L3 may be disposed on the touch layer 40; or may be disposed on other conductive film layers of the display panel.

In the present disclosed display panel, the first detection segment L1 may extend along the direction surrounding the hole area KA, and both ends of the first detection segment L1 may be connected to the detection pads P sequentially through the second detection segments L2 and the third detection segments L3, respectively. Thus, when the first detection segment L1 is continuous without a disconnection, a certain resistance value may be detected from the detection line L through the two detection pads P. When a crack (s) is formed around the hole area AA during the process for drilling the display panel to form the hole area AA, the first detection section L1 may be broken at the position of the crack(s), and the resistance value of the detection line L detected by the two detection pads P may be increased. Thus, by detecting the change of the resistance value on the detection line L from the two detection pads P, whether the first detection segment L1 is broken may be determined; and whether one or more cracks are formed at the edge of the hole area KA and extends to the display area AA may be determined. In particular, the crack detection may be realized Further, to achieve a higher resolution of the display panel, the density of the display pixels disposed in the display area AA has been larger and larger, and accordingly, the pixel circuit arrangement density of the substrate layer 10 has also been increased. Thus, the wiring of each conductive film layer in the substrate layer 10 in the display area AA has become more and more compact. Further, disposing the second detection segments L2 on the touch layer 40 in the display area AA may not affect the wiring of each conductive layer in the substrate layer 10; and may not disturb the signal transmission in the pixel circuit. Thus, when the crack detection in the hole area KA is realized, the complexity of the wiring in the substrate layer 10 may not be increased, and the display effect of the display panel may not be affected.

In summary, the display panel provided by the present disclosure may be able to detect the crack (s) at the edge of the hole area by disposing the detection line and the detection pads. At the same time, the touch layer may be integrated in the display panel, and the detection line may be disposed in the touch layer. Thus, the detection line may not increase the complexity of the wiring inside the substrate layer; and may not affect the display effect of the display panel.

Figure 3:
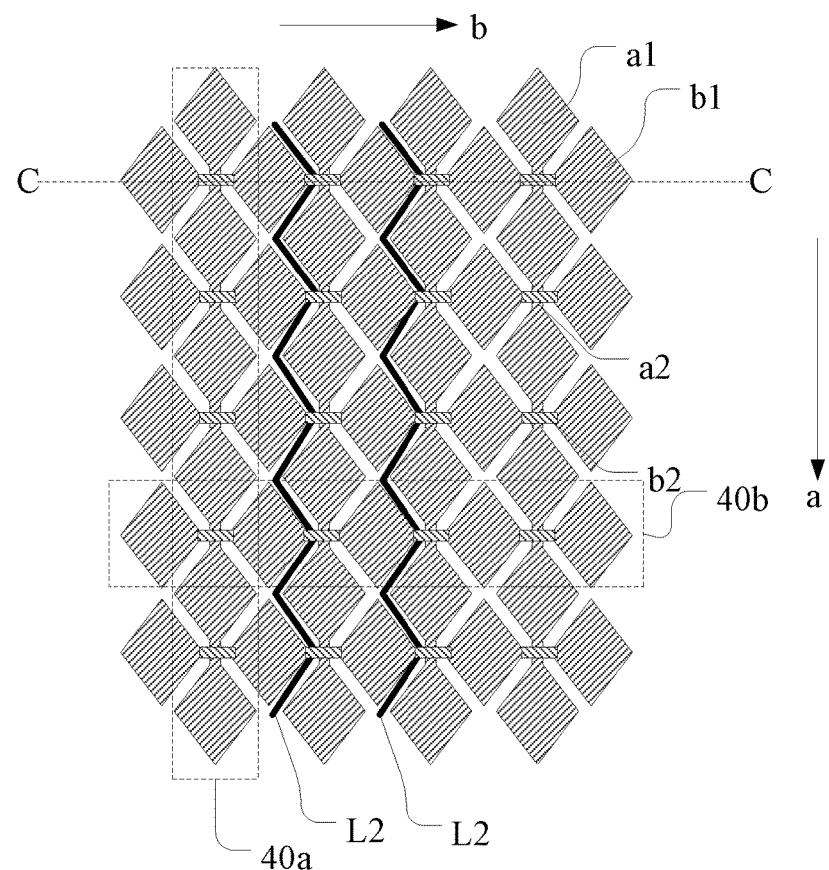
FIG. 3 illustrates a touch layer of an exemplary display panel consistent with various disclosed embodiments of the present disclosure.

FIG. 3 illustrates a touch layer of an exemplary display panel consistent with various disclosed embodiments of the present disclosure. As show in FIG. 3, in one embodiment, the touch layer may include a plurality of first touch electrodes 40a and a plurality of second touch electrodes 40b. When the plurality of first touch electrodes 40a are sensing electrodes, the plurality of second touch electrodes 40b may be driving electrodes. When the plurality of first touch electrodes 40a are driving electrodes, the plurality of second touch electrodes 40b may be sensing electrodes. The touch detection based on the mutual capacitance principle is implemented by the plurality of first touch electrodes 40a and the plurality of the second touch electrodes 40b. Each of the plurality of first touch electrodes 40a may include a plurality of first electrode blocks a1 sequentially connected along a first direction a; and each of the plurality of second touch electrodes 40b may include a plurality of second electrode blocks b1 sequentially connected along a second direction b. The first direction a may be perpendicular to the second direction b; and the orthographic projection of the second detection segments L2 on the substrate layer 10 may not overlap with the orthographic projection of the first electrode blocks a1 and the second electrode blocks b1 on the substrate layer 10. In particular, from the top view of the touch layer 10 illustrated in FIG. 3, the second detection segments L2 may not overlap with the first electrode blocks a1 and the second electrode blocks b1.

In such a the display panel provided by the present disclosure, the second detection segments may not overlap with the first electrode blocks and the second electrode blocks in the touch area. In particular, the second detection segments may be disposed between the first electrode blocks and the second electrode blocks. Thus, the influence of the second detection segments on the first electrode blocks and the second electrode blocks may be reduced. Further, the layer structures of the electrode region and the non-electrode region where the first touch electrodes and the second touch electrodes are disposed may be different; and may have visible electrode patterns. In particular, the light transmission conditions in the region with the spacings disposed with the electrode blocks and the region with the spacings without being disposed with electrode blocks may be different. In the spacings disposed with the detection line, and the difference in light transmission between the region having the spacings and the region having no spacings may be reduced. Under the condition that the spacings among the electrode blocks are not affected, the spacings without being covered with the conductive layer may be reduced to a size that may be invisible by the naked eyes and the light-emitting effect may be improved.

Figure 4:
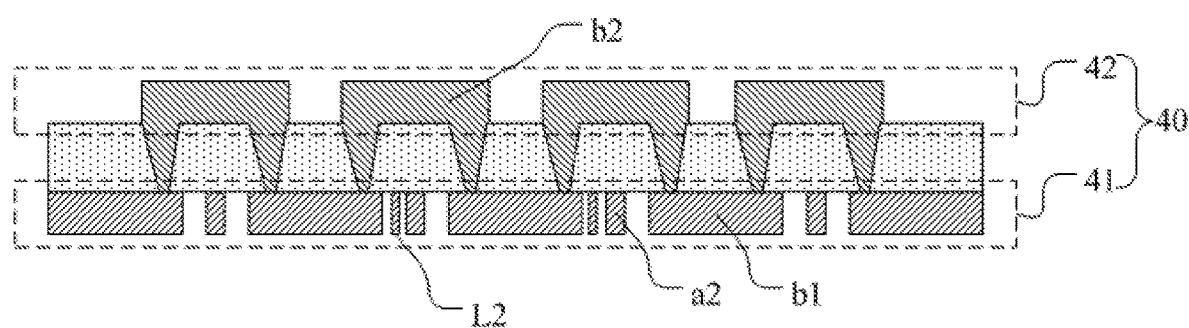
FIG. 4 illustrates a layer structure of a touch layer of an exemplary display panel consistent with various disclosed embodiments of the present disclosure.

FIG. 4 illustrates a layer structure of a touch layer of an exemplary display panel consistent with various disclosed embodiments of the present disclosure. FIG. 4 may be a CC-sectional view of the structure in FIG. 3.

As shown in FIG. 3 and FIG. 4, in one embodiment, the touch layer 40 may include a touch pattern layer 41 and a touch bridge layer 42. The first electrode blocks a1, the second electrode blocks b1, and the connection portions a2 each connecting two adjacent first electrode blocks a1 may be disposed on the touch pattern layer 41. The second connection portions b2 each connecting two adjacent second electrode blocks b1 may be disposed on the touch bridge layer 42. All or portion of the second detection segments L2 may be disposed on the touch pattern layer 41. When the trace of the second detection segments L2 in the touch pattern layer 41 needs to avoid the first electrode blocks a1, the second electrode block b1 or the first connection portions a2, the second detection segments L2 may be jumped to the touch bridge layer 42 and may be connected by bridges. In particular, the second detection segments L2 may include portions disposed on the touch pattern layer 41 and portions disposed on the touch bridge layer 42.

For such a display panel provided by the present disclosure, the second detection segments may be disposed on the touch pattern layer to avoid additionally adding a film layer in the touch layer. Thus, the thickness of the display panel may be reduced.

Further, referring to FIG. 3 and FIG. 4, in one embodiment, the second detection segments L2 may be entirely disposed in the touch pattern layer 41, and the second detection segments L2 may extend along the first direction a. In particular, at the macroscopic level, the second detection segments L2 may extend along the first direction a, and at the microscopic level, the second detection segments L2 may include a plurality of interconnected line segments.

For such a display panel provided by the present disclosure, because the second detection segments may all be disposed on the touch pattern layer, an extra film layer may not need to be formed on the touch layer. At the same time, the second detection segments may be disposed in a single film layer, and the jumper via(s) may be avoided; and the fabrication process may be simplified. Further, by setting the second detection segments to be consistent with the extending direction of the first touch electrodes in the touch layer, the short-circuit issue between the second detection segments and the first connection portions of the first touch electrodes may be avoided; and the adverse effect of the short-circuit issue to the detection accuracy of the touch electrodes may be prevented. Along the first direction, the second detection segments may be disposed between two adjacent first electrode blocks, and along the second direction, the second detection segments may be disposed between two adjacent second electrode blocks. In particular, the second detection segments may not overlap with neither the first electrode blocks nor the second electrode blocks, and the influence of the second detection segments on the first electrode blocks and the second electrode blocks may be reduced.

Figure 5:
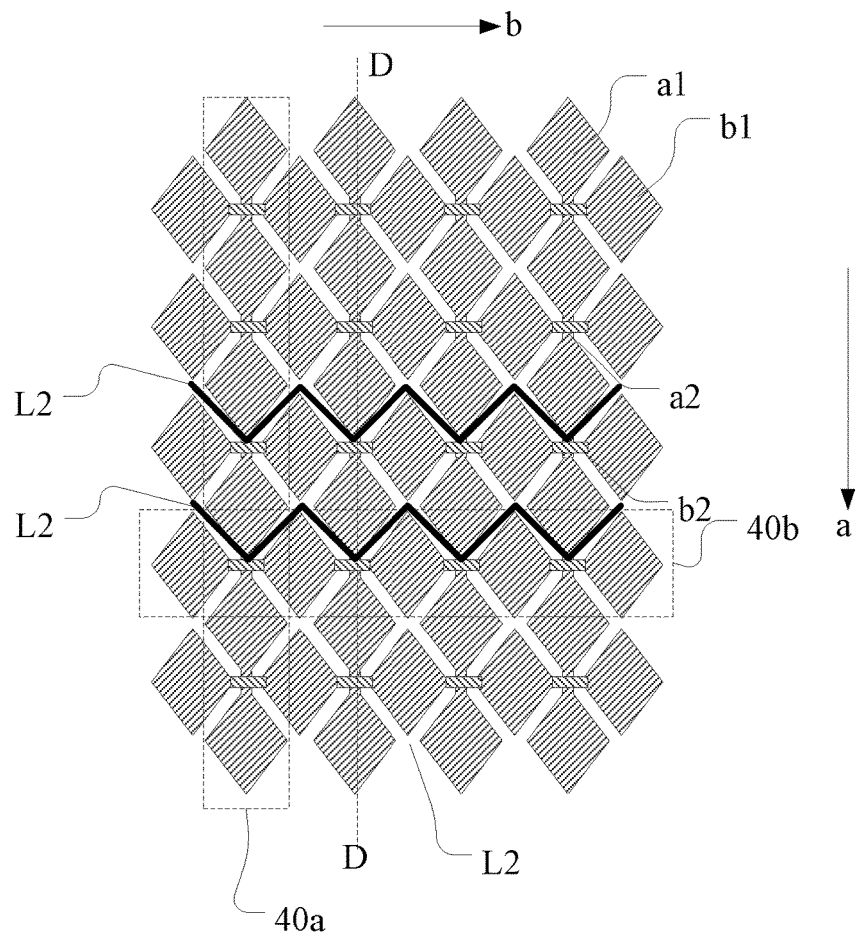
FIG. 5 illustrates a touch layer of another exemplary display panel consistent with various disclosed embodiments of the present disclosure.
Figure 6:
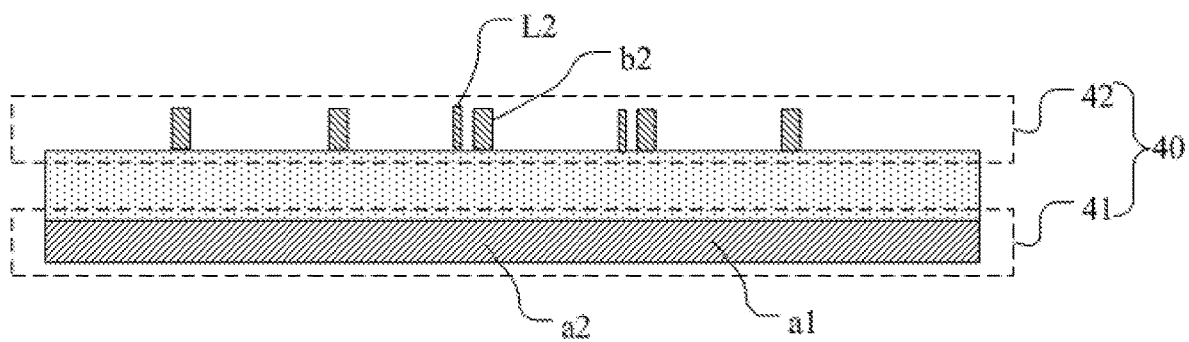
FIG. 6 illustrates a layer structure of a touch layer of another exemplary display panel consistent with various disclosed embodiments of the present disclosure.

FIG. 5 illustrates a touch layer of another exemplary display panel consistent with various disclosed embodiments of the present disclosure. FIG. 6 illustrates a layer structure of the touch layer of another exemplary display panel consistent with various disclosed embodiments of the present disclosure. FIG. 6 may be a D-D-sectional view of the structure in FIG. 5.

As shown in FIG. 5 and FIG. 6, in one embodiment, the touch layer 40 may include a touch pattern layer 41 and a touch bridge layer 42. The first electrode blocks a1, the second electrode blocks b1, and the first connection portion a2 each connecting adjacent first electrode blocks a1 may be disposed on the touch pattern layer 41. The second connection portions b2 each connecting adjacent second electrode blocks b1 may be disposed on the touch bridge layer 42. All or part of the second detection segments L2 may be disposed on the touch bridge layer 42. When the second detection segments L2 need to avoid the second connection portions b2 in the trace of the touch bridge layer 42, the second detection segments L2 may be jumped to the touch pattern layer 41 and connected by bridging. In particular, the second detection segments L2 may include portions disposed on the touch pattern layer 41 and portions disposed on the touch bridge layer 42.

For such a display panel provided by the present disclosure, the second detection segments may be disposed on the touch bridge layer to avoid additionally adding a film layer on the touch layer. Thus, the thickness of the display panel may be reduced.

Further, referring to FIG. 5 and FIG. 6, in one embodiment, the second detection segments L2 may all be disposed on the touch bridge layer 42. The second detection segment L2 may extend along the second direction b. In particular, at the macroscopic level, the second detection segments L2 may extend along the second direction b. At the microscopic level, the second detection segments L2 may include a plurality of interconnected line segments.

For such a display panel provided by the present disclosure, because the second detection segments may all be disposed on the touch bridge layer, an extra film layer may not need to be formed on the touch layer. At the same time, the second detection segments may be located on a single film layer, and a jumper may not be required. Thus, the fabrication process may be simplified. Further, by setting the second detecting segments to be consistent with the extending direction of the second touch electrodes in the touch layer, a short-circuit issue between the second detection segments and the second connection portions in the second touch electrode may be avoided; and the effect of the second touch electrodes to the detection accuracy may be prevented. Along the first direction, the second detection segments may be disposed between two adjacent first electrode blocks, and along the second direction, the second detection segments may be disposed between two adjacent second electrode blocks. In particular, the second detection segments may not overlap neither the first electrode blocks nor the second electrode blocks. Thus, the influence of the second detecting segments to the first electrode blocks and the second electrode blocks may be reduced.

Figure 7:
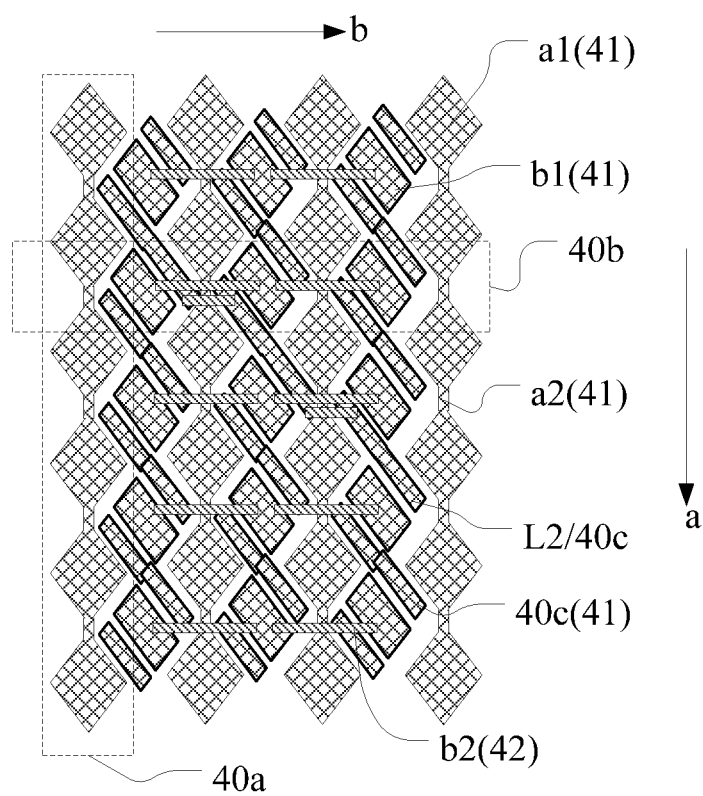
FIG. 7 illustrates a touch layer of another exemplary display panel consistent with various disclosed embodiments of the present disclosure.

FIG. 7 illustrates a touch layer of another exemplary display panel consistent with various disclosed embodiments of the present disclosure. As shown in FIG. 7, in one embodiment, the touch layer may include a first touch electrode 40a and a second touch electrode 40b. The first touch electrode 40a may include a plurality of first electrode blocks a1 sequentially connected along a first direction a. The second touch electrode 40b may include a plurality of second electrode block b1 sequentially connected along a second direction b. The first direction a may be perpendicular to the second direction b. The touch layer may include a touch pattern layer 41 and a touch bridge layer 42. The first electrode blocks a1, the second electrode blocks b1 and the first connecting portions a2 each connecting two adjacent first electrode blocks a1 may be disposed on the touch pattern layer 41. The second connection portions b2 each connecting two adjacent second electrode blocks b1 may be disposed on the touch bridge layer 42. The touch pattern layer 41 may include a plurality of metal meshes. The first electrode blocks a1 and the second electrode blocks b1 may also be formed by metal meshes. The second detecting segments L2 may multiplex the metal meshes.

For such a display panel provided by the present disclosure, the second detection segment may multiplex the metal meshes, the risk of the disconnection of the second detection segments may be reduced. Even if one metal wire of the metal mesh is broken, the second detection segments may still be connected through other metal wires. Thus, the reliability of the detection line may be improved, and the probability of misjudgment caused by the disconnection of the second detection segments may be reduced.

Further, in one embodiment, the touch pattern layer 41 may also include dummy electrodes 40c corresponding to the first electrode blocks a1 and the second electrode blocks b1, respectively. The dummy electrodes 40c may be electrically insulated from the first electrode blocks a1 and the second electrode block b1; and may be disposed between the first electrode blocks a1 and the second electrode blocks b1; and may be connected to a fixed potential or a floating potential. The second detection segments L2 may partially multiplex the dummy electrodes 40c; and may be partially disposed on the touch bridge layer 42.

Figure 8:
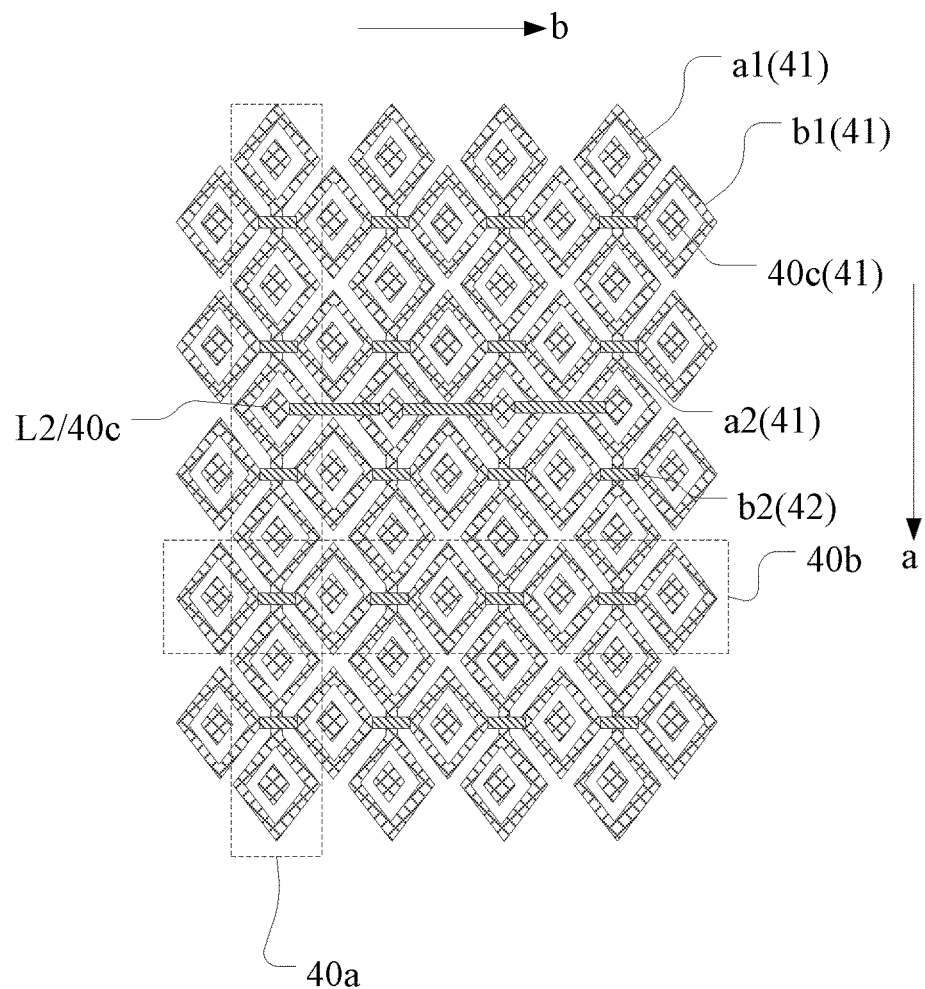
FIG. 8 illustrates a touch layer of another exemplary display panel consistent with various disclosed embodiments of the present disclosure.

FIG. 8 illustrates a touch layer of another exemplary display panel consistent with various disclosed embodiments of the present disclosure. As shown in FIG. 8, the dummy electrodes 40c may be surrounded by the first electrode blocks a1 or the second electrode blocks b1. The second detection segments L2 may partially multiplex the dummy electrodes 40c; and may also be partially disposed on the touch bridge layer 42.

For such a display panel provided by the present disclosure, the second detection segments may multiplex the dummy electrodes. Thus, the touch layer may be effectively utilized. Not only the crack in the hole area may be detected, but also the coupling capacitance generated by the touch layer to other signal lines in the display area may be reduced. Accordingly, it may not only ensure the original function of the dummy electrodes in the normal operation stage of the display panel, but also reduce the space occupied by the wiring.

Figure 9:
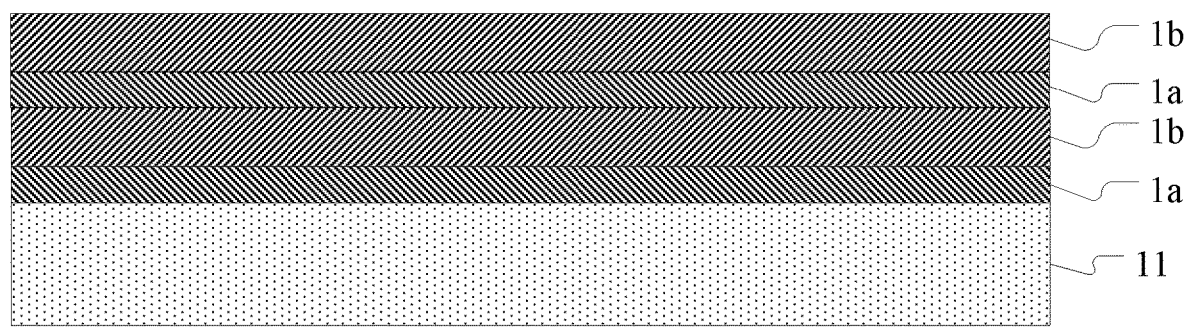
FIG. 9 illustrates a layer structure of a substrate layer of an exemplary display panel consistent with various disclosed embodiments of the present disclosure.

FIG. 9 illustrates a layer structure of a substrate layer of an exemplary display panel consistent with various disclosed embodiments of the present disclosure. In one embodiment, as shown in FIG. 9, FIG. 1 and FIG. 2, the substrate layer may include a base layer 11, a plurality of first conductive layers 1a formed on one surface of the base layer 11 and an insulation layer 1b formed between two adjacent conductive layers 1a. The first detection segment L1 and the second detection segments L2 may be disposed on a same conductive layer 1a or different conductive layers 1a of the substrate layer 10. In particular, the second detection segments L2 may extend in the display area AA, and one end of the second detection segment L2 may reach the inner bezel area BA1 and may be connected to the first detecting segment L1, and the other end of the second detection segment may reach the outer bezel area BA1; and may be connected to the third detection segment L3. The second detection segment L2 and the first detection segment L1, and the second detection segment L2 and the third detection segment L3 may be connected by a via or a bridge.

For such a display panel provided by the present disclosure, the detection pad may be disposed on the substrate layer. Thus, the end of the detection line connected to the detection pad in the bezel area may be disposed on the substrate layer. The film encapsulation structure of the display panel may be combined with the touch layer to form a carrier substrate. Such a structure ensure that the detection line may cross the display area without affecting the pixel circuit of the display area, and at the same time, the issue that the detection line is broken when bridging may be avoided. Further, the film encapsulation structure may have a small difference with the substrate layer at the edge of the encapsulation structure; and a sloped surface may be formed, and the detection line may be carried to extend from the touch layer to the substrate layer. In addition, the detection line and the wiring of the touch layer may be disposed on a same layer to multiplex the wiring method between the touch layer the substrate layer. Thus, the fabrication process may be simplified.

Figure 10:
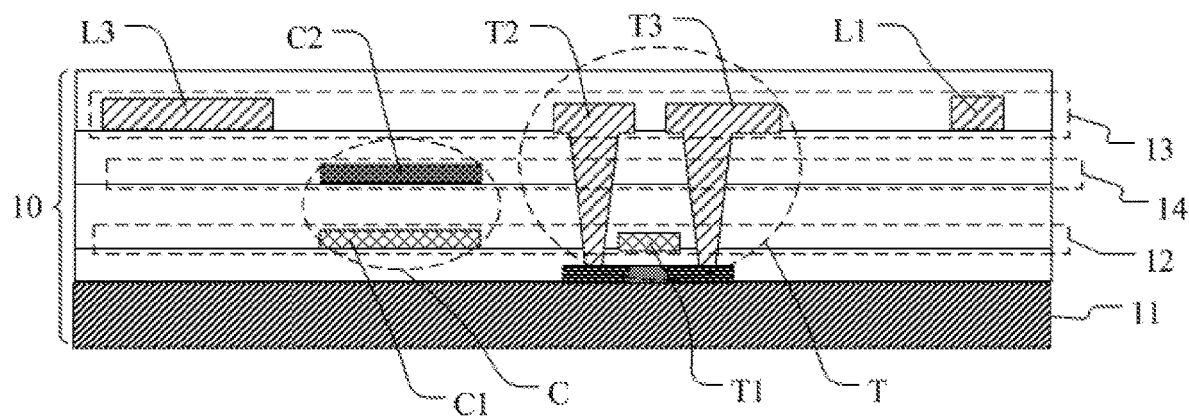
FIG. 10 illustrates a layer structure of a substrate layer of another exemplary display panel consistent with various disclosed embodiments of the present disclosure.

FIG. 10 illustrates a layer structure of a substrate layer of another exemplary display panel consistent with various disclosed embodiment of the present disclosure. In one embodiment, as shown in FIG. 10, the conductive layers in the substrate layer may include a gate electrode layer 12, a source/drain electrode layer 13 and a storage capacitor layer 14. The gate electrode layer 12 may be configured to dispose a gate electrode T1 of the thin film transistor T and a first plate C1 of the storage capacitor C. The storage capacitor layer 14 may be configured to dispose a second plate C2 of the storage capacitor C. The source/drain electrode layer 13 may be configured to dispose the source T2 and the drain T3 of the thin film transistor T. The first detection segment L1 and the third detection segments L3 may be both disposed on the source/drain electrode layer 13 to be close to the touch layer such that it may be convenient for the connection of the second detection segments on the touch layer. In some embodiments, the first detection segment L1 and/or the third detection segments L3 may also be disposed on at least one of the gate electrode layer 12, the source/drain electrode layers 13, and the storage capacitor layer 14.

Figure 11:
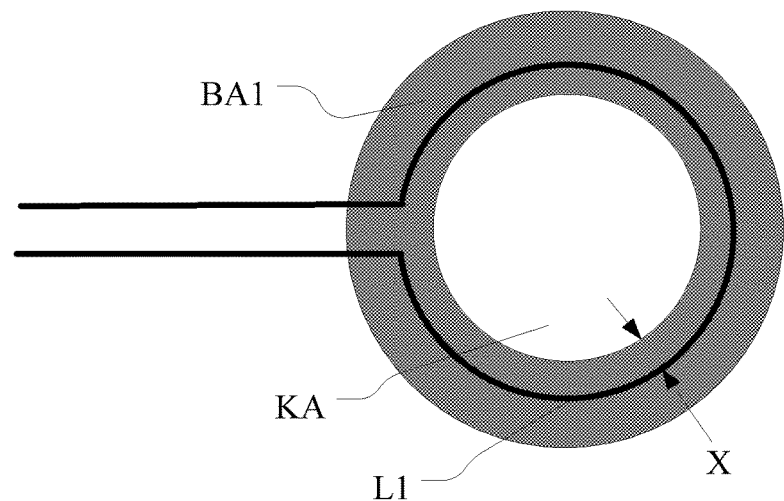
FIG. 11 illustrates a detection line of an exemplary display panel consistent with various disclosed embodiments of the present disclosure.

FIG. 11 illustrates a detection line of an exemplary display panel consistent with various disclosed embodiments of the present disclosure. As shown in FIG. 11, in one embodiment, a distance X between the first detection segment L1 and the edge of the hole area KA may be greater than or equal to approximately 50 micrometers and less than or equal to approximately 100 micrometers.

For such a display panel provided by the present disclosure, the distance between the first detection segment and the edge of the hole area may be set to be between approximately 50 micrometers and approximately 100 micrometers. Such a distance may also be the distance between the first detection segment and the cutting line of the hole area. Thus, the distance between the first detection segment and the cutting line of the hole area may also be set to be between approximately 50 micrometers and approximately 100 micrometers. On the one hand, setting the distance between the first detection segment and the cutting line of the hole area to be least approximately 50 micrometers may avoid cutting the first detection segments due to a cutting error. On the other hand, other signal wirings, such as data line wirings, etc., may also be disposed in the inner bezel area, and the first detection segment may be disposed at a side of the signal wirings adjacent to the hole area. Setting the distance between the first detection segment and the cutting line of the hole area to be up to 100 micrometers may avoid increasing the width of the bezel of the inner frame area at the hole area. Thus, the screen ratio of the display panel may be increased.

Figure 12:
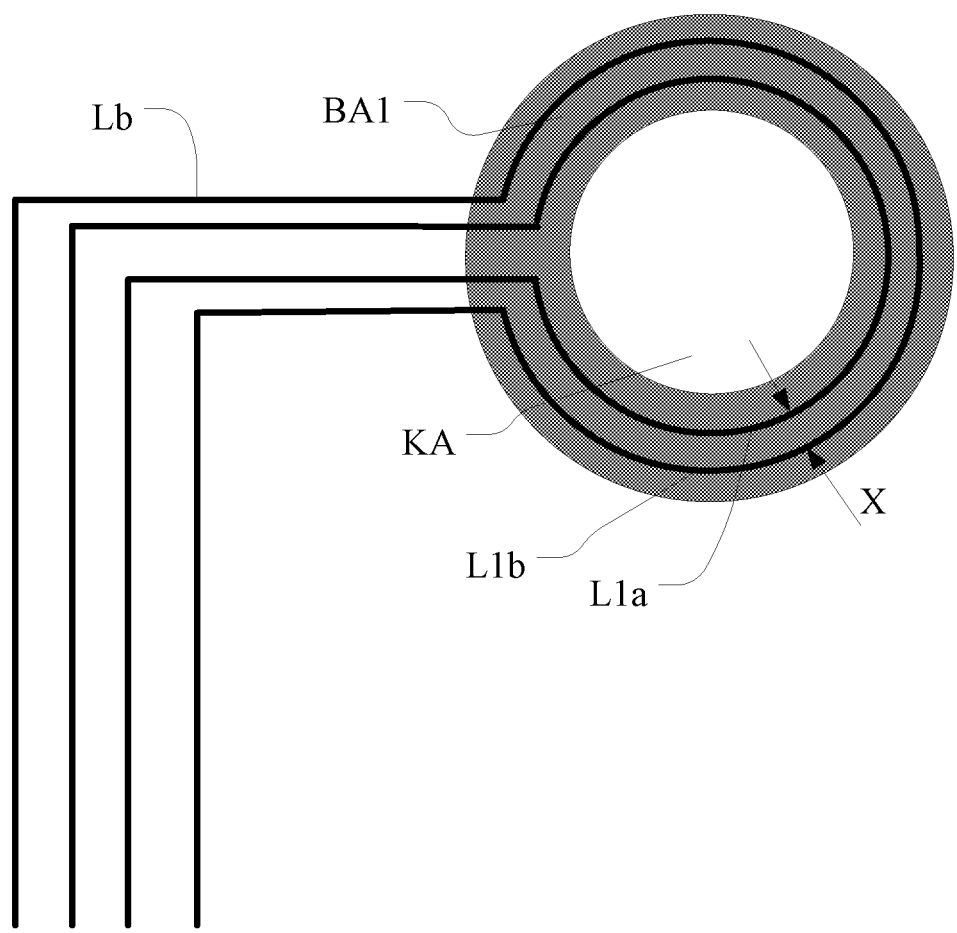
FIG. 12 illustrates a detection line of another exemplary display panel consistent with various disclosed embodiments of the present disclosure.

FIG. 12 illustrates a detection line of another exemplary display panel according to various disclosed embodiments of the present disclosure. As shown in FIG. 12, in one embodiment, the display panel may include a first detection line La and a second detection line Lb. The first detection line La and the second detection line Lb may be two different detection lines L insulated from each other. A distance between the first detection segment L1a of the first detection line La and the first detection segment L1b of the second detection line Lb may be approximately 50 micrometers.

For such a display panel provided by the present disclosure, two detection lines may be disposed along the direction surrounding the hole area to detect a crack(s) in the hole area. Further, the interval between the first detection segments of the two detection lines may be set as approximately 50 micrometers, it may also be able to detect the extent degree of the cracks toward the display area.

Further, referring to FIG. 12, in one embodiment, the distance between the first detection segment L1a of the first detecting line La and the edge of the hole area KA may be approximately 50 micrometers, and the distance between the first detection section L1b of the second detection line Lb and the edge of the hole area KA may be approximately 100 micrometers.

For such a display panel provided by the present disclosure, the distance between the first detection segment of the first detection line and the edge of the hole area may be set to approximately 50 micrometers, and the distance between the first detection segment of the second detection line and the edge of the hole area may be set to approximately 100 micrometers, the increasing of the width of the bezel of the inner frame area at the hole area may be avoided; and the screen ratio of the display panel may be increased.

Figure 13:
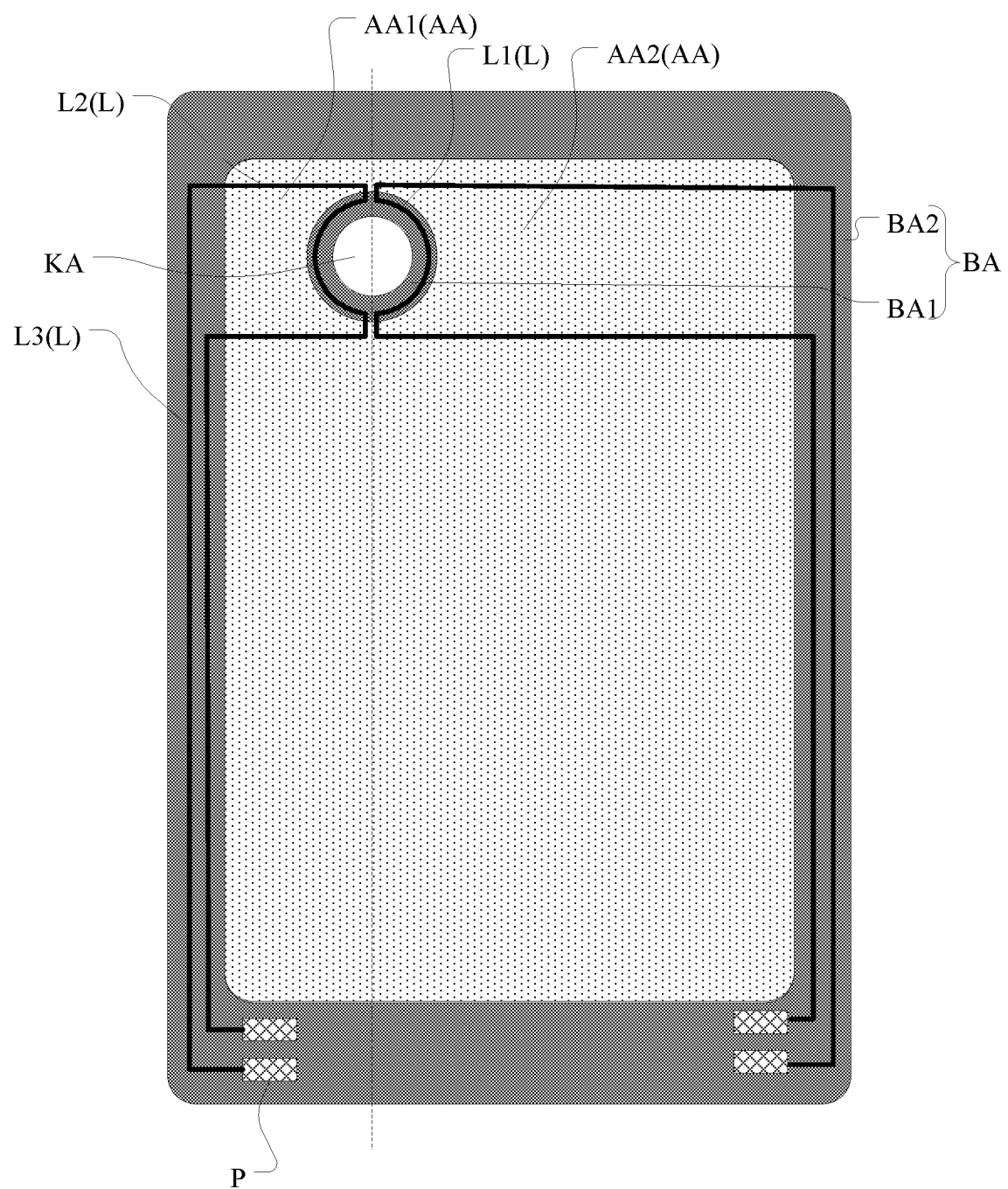
FIG. 13 illustrates a top view of another exemplary display panel consistent with various disclosed embodiments of the present disclosure.

FIG. 13 illustrates a top view of another display panel consistent with various disclosed embodiments of the present disclosure. In one embodiment, as shown in FIG. 13, the display area AA of the display panel may include a first display area AA1 and a second display area AA2 located at both sides of the hole area KA. The display panel may include four detection soldering pads P. The detection lines L may include two first detection segments L1, four second detection segments L2, and four third detection segments L3. One of the two first detection segments L1 may be disposed between the hole area KA and the first display area AA1; and the other of the two first detection segments L1 may be disposed between the hole area KA and the second display area AA2. Two of the four second detection segments L2 may be disposed in the first display area AA1; and the other two of the four second detection segments L2 may be disposed in the second display area AA2.

For such a display panel provided by the present disclosure, different first detection segments may be respectively disposed at both sides of the hole area, or more first detection segments may be disposed at the hole area. All the first detection segments may surround the hole area along the direction surrounding the hole area. Thus, cracks in all directions of the hole area may be detected. At the same time, the positions of the cracks may also be determined.

Figure 14:
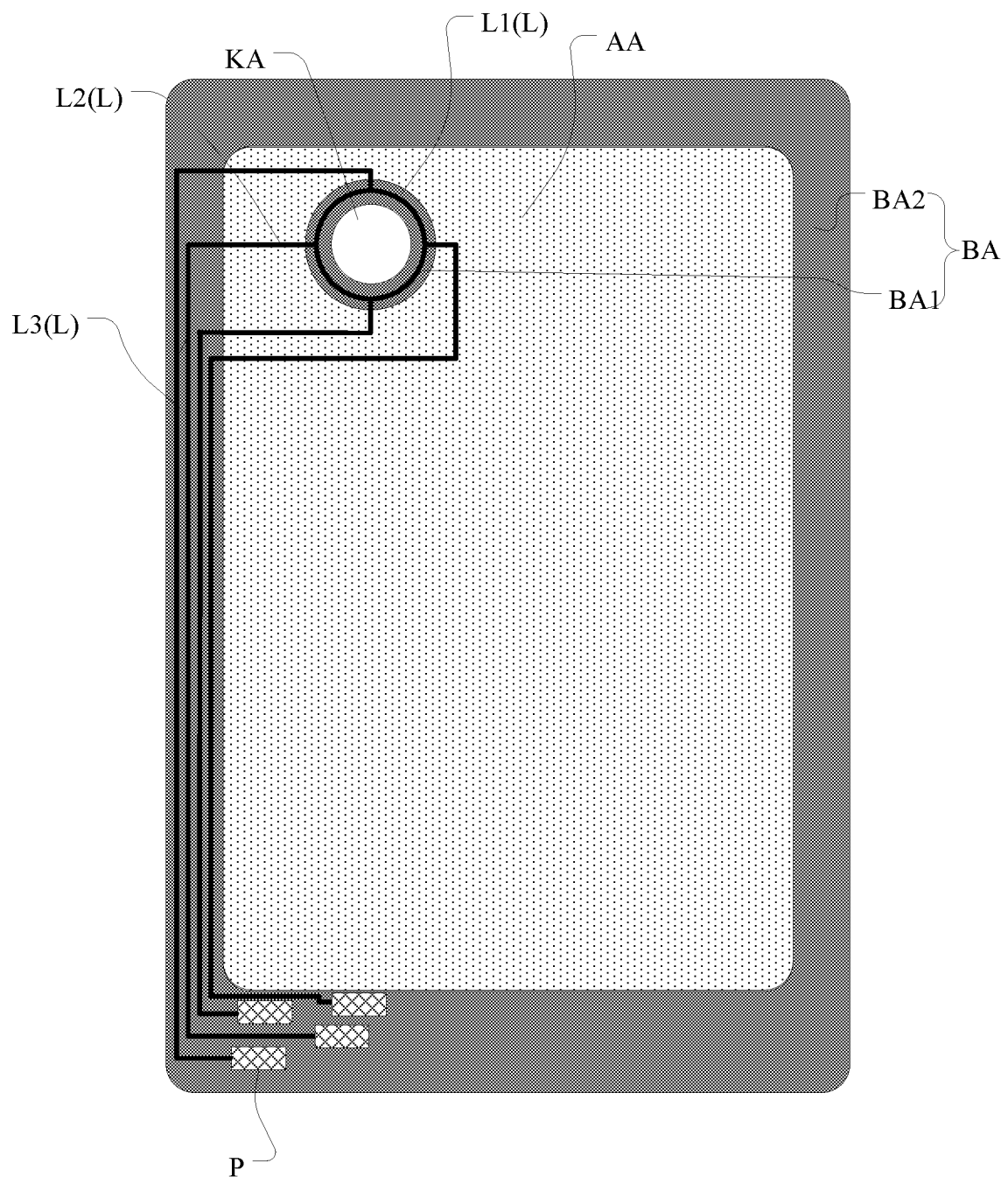
FIG. 14 illustrates a top view of another exemplary display panel consistent with various disclosed embodiments of the present disclosure.

FIG. 14 illustrates a top view of another exemplary display panel consistent with various disclosed embodiments of the present disclosure. In one embodiment, as shown in FIG. 14, the display panel may include a number N of detection pads P. N is equal to or greater than or 3. The detection lines L may include the number N of second detection segments L2 and the number N of third detection segments L3. One end of each second detection segment L2 may be respectively connected to different positions of one first detection segment L1, and the other end of the second detection segment L2 may be respectively connected to the detection pad P through a third detection segment L3. For illustrative purposes, in FIG. 14, N is 4.

For such a display panel provided by the present disclosure, a plurality of second detection segments and third detection segments may be connected to different positions of a first detection segment and may be connected to the detection soldering pads. Thus, a crack between the corresponding positions of the first detection segment corresponding to two detection soldering pads may be detected through any two detection soldering pads; and cracks in all directions of the hole area may be detected. At the same time, the positions of the cracks may also be determined.

Figure 15:
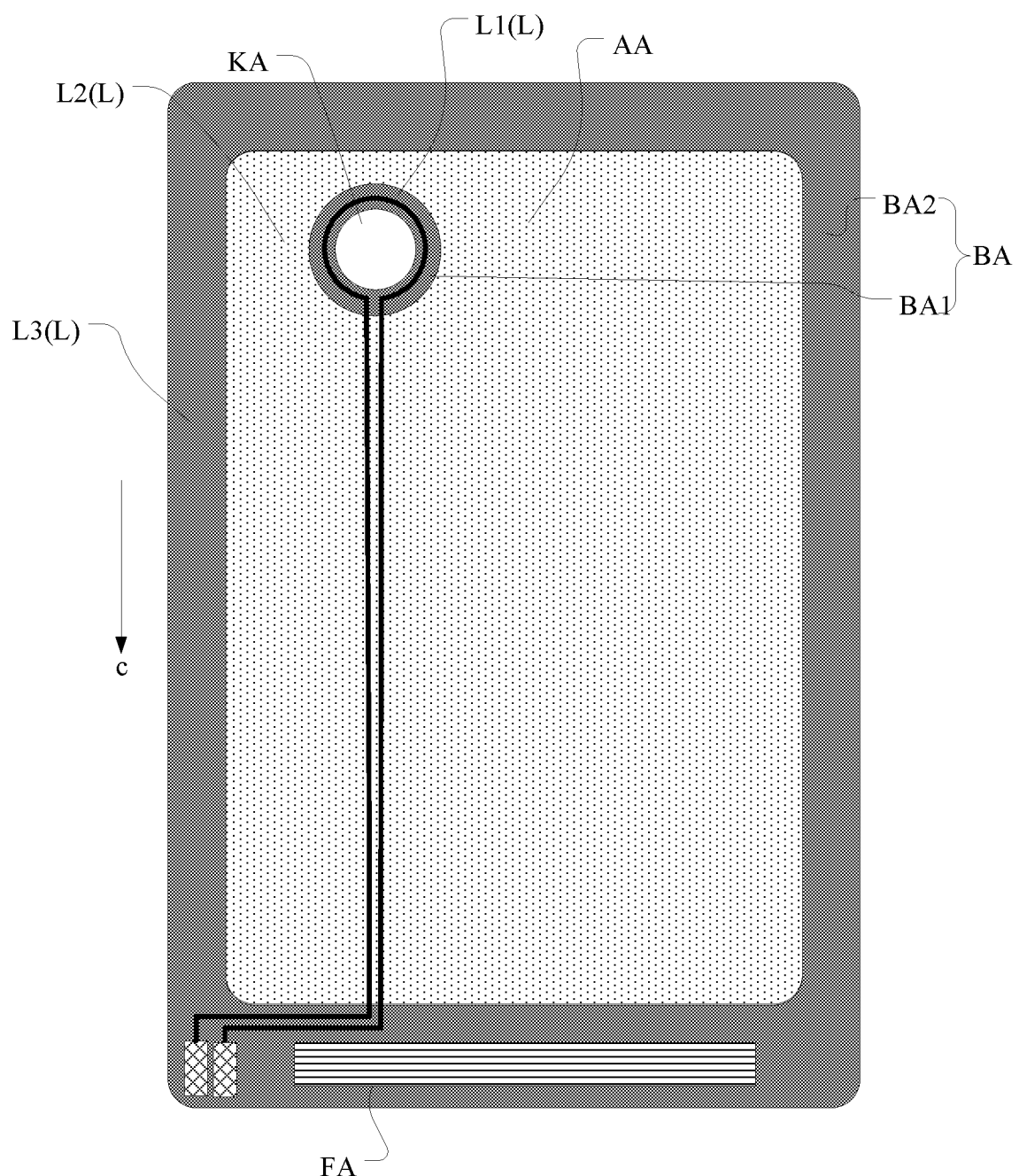
FIG. 15 illustrates a top view of another exemplary display panel consistent with various disclosed embodiments of the present disclosure.

FIG. 15 illustrates a top view of another exemplary display panel consistent with various disclosed embodiments of the present disclosure. In one embodiment, as shown in FIG. 15, the outer bezel area BA2 may include a bonding area FA, and the bonding area FA may be used for bonding an integrated circuit (IC) chip or a flexible circuit board having an integrated circuit (IC) chip. The bonding area FA and the hole area KA may be sequentially disposed along a third direction c. The third direction c may be in parallel with a plane in which the display panel is located. The second detection segments L2 may extend along the third direction c.

For such a display panel provided by the present disclosure, the extending directions of the second detection segments and the third detection segments may be consistent with the direction of the relative positions of the bonding area and the hole area, and the wiring length of the third detection segments in the outer bezel area may be reduced. Further, the effect of the third detection segments on the signal lines in the outer bezel area may be reduced. When the bonding area is located at the lower bezel area of the display panel, the left and right bezels of the display panel may not need to be provided with the third detection segments. Thus, the widths of the left and right bezels of the display panel may be reduced.

Figure 16:
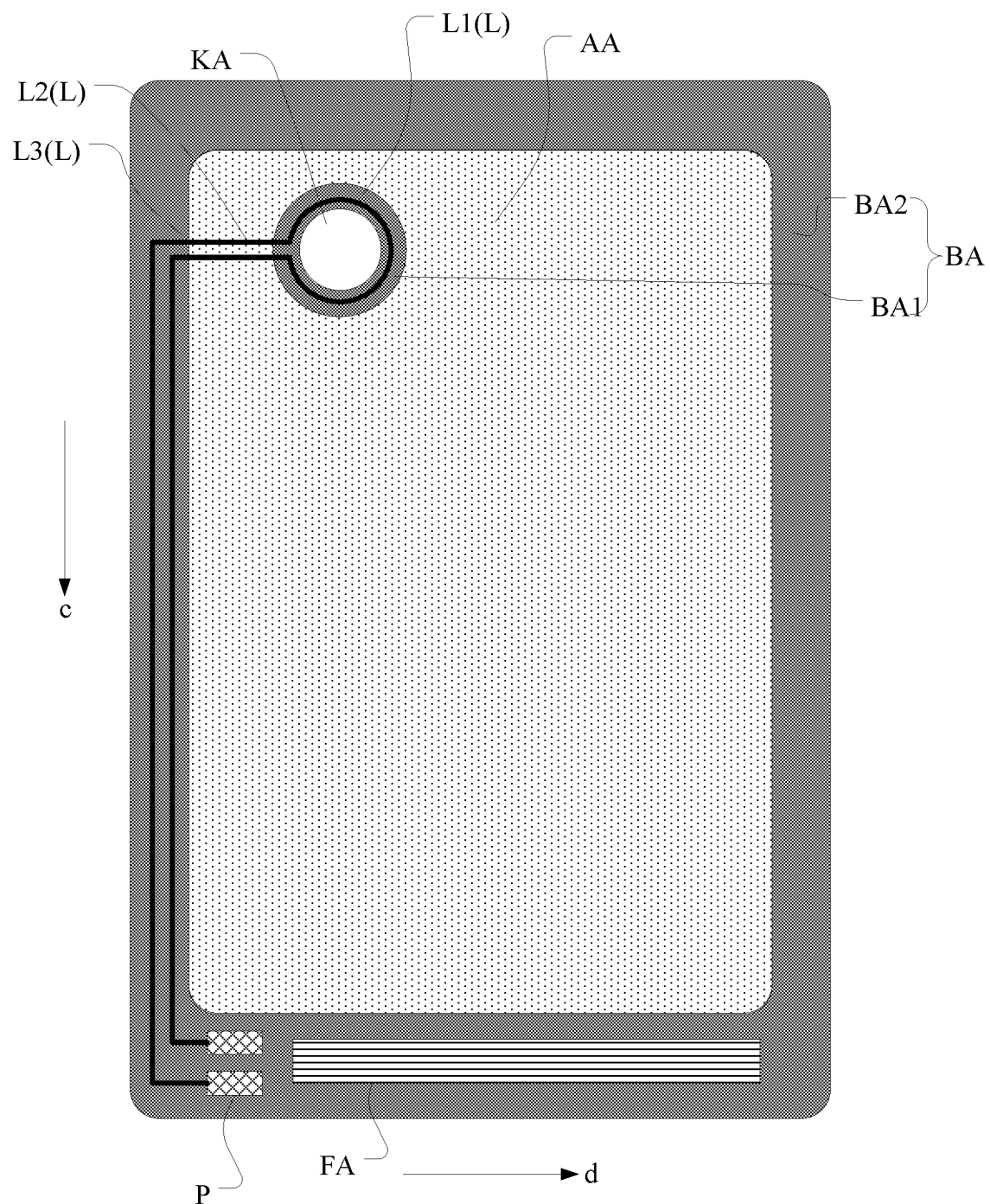
FIG. 16 illustrates a top view of another exemplary display panel consistent with various disclosed embodiments of the present disclosure.

FIG. 16 illustrates a top view of another display panel consistent with various disclosed embodiment of the present disclosure. In one embodiment, as shown in FIG. 16, the outer bezel area BA2 may include a bonding area FA; and the bonding area FA may be used for bonding an integrated circuit chip or a flexible circuit board having an integrated circuit chip. The binding area FA and the hole area KA may be sequentially disposed along the third direction c. The second detection section L2 may extend along the fourth direction d. The third direction c may intersect with the fourth direction d; and may be in parallel with the plane in which the display panel is located.

For such a display panel provided by the present disclosure, the extending direction of the second detection segments and the third detection segments may be perpendicular to the direction of the relative position of the bonding region and the hole region. Thus, the wiring length of the second detection segments in the display area may be reduced; and the influence of the second detection segments on the signal lines in the display area may be reduced.

The above are the embodiments of the display panel provided by the present disclosure. The present disclosure also provides a display apparatus. The display apparatus may include any display panel provided by the present disclosure or other appropriate display panel having the technical features and corresponding technical effects.

Figure 17:
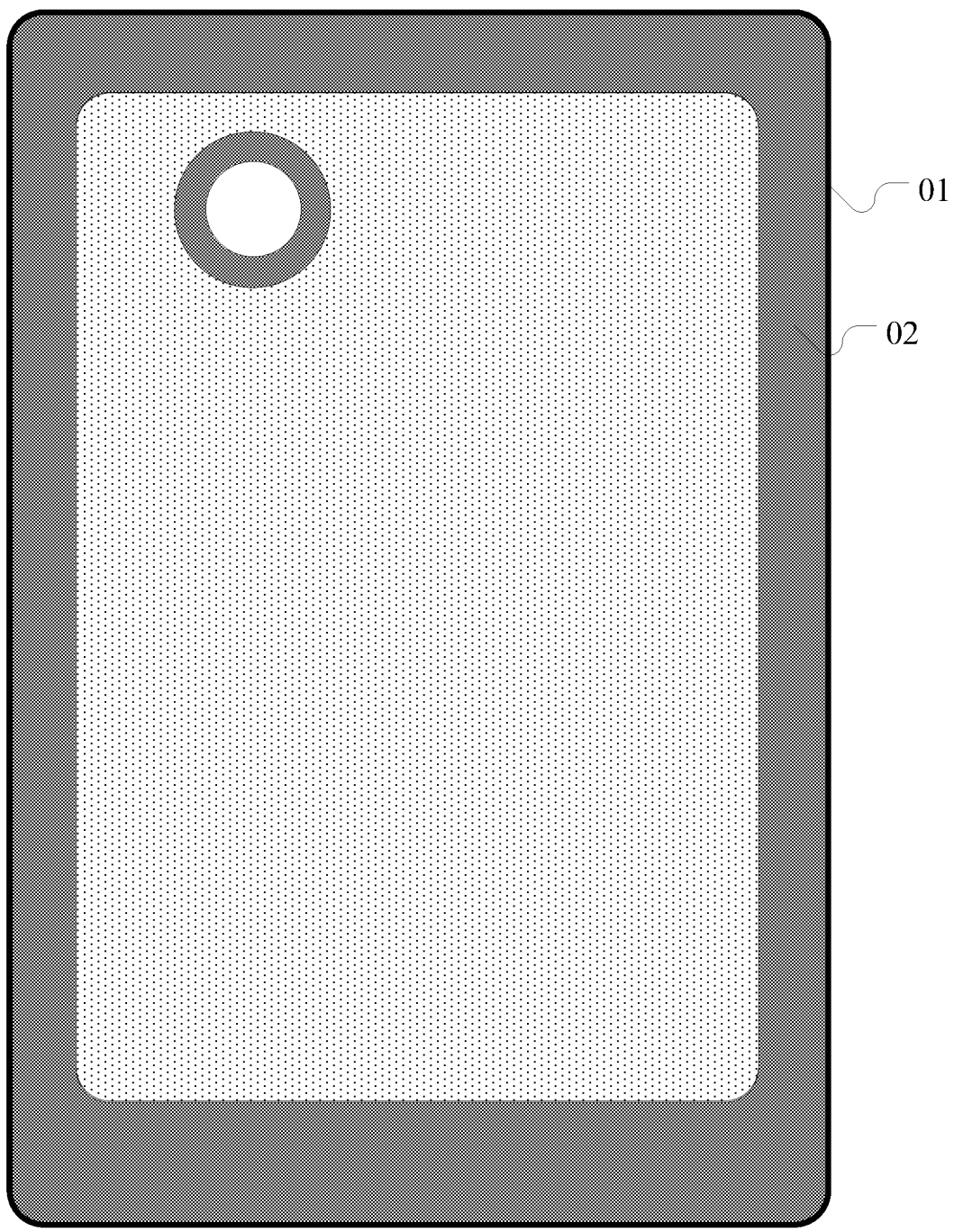
FIG. 17 illustrates an exemplary display apparatus consistent with various disclosed embodiments of the present disclosure.

FIG. 17 illustrates an exemplary display panel consistent with various disclosed embodiments of the present disclosure. As shown in FIG. 17, the display panel may include a case 01 and a display panel 02 disposed in the case 01. The display panel 02 may be any disclosed display panel provided by the present disclosure, or other appropriate display panel.

It can be seen from the above embodiments that the display panel and the display apparatus provided by the present disclosure may achieve at least the following beneficial effects.

By setting the detection line(s) and the detection soldering pad(s), the crack detection at the edge of the hole area may be realized. At the same time, the touch layer may be integrated in the display panel, and the detection line may be disposed on the touch layer. The detection line may not increase the complexity of the wiring in the substrate layer; and it may also not affect the display performance of the display panel.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A display panel, comprising:
  a display area, a bezel area, and a hole area, wherein the bezel area includes an inner bezel area surrounding the hole area and an outer bezel area surrounding the display area, and the display area surrounds the hole area and is disposed between the inner bezel area and the outer bezel area;
  a substrate layer, a light-emitting layer, an encapsulation layer and a touch layer, that are sequentially stacked;
  at least two detection soldering pads disposed in the outer bezel area; and
  a detection line, including at least one first detection segment disposed in the inner bezel area, at least two second detection segments disposed in the display area and at least two third detection segments in outer bezel area,
  wherein:
  the at least one first detection segment extends along a direction surrounding the hole area;
  two ends of a first detection segment of the at least one first detection segment are respectively connected to two different second detection segments of the at least two second detection segments;
  a third detection segment of the at least two third detection segments is connected between a second detection segment of the at least two second detection segments and a detection soldering pad of the at least two detection soldering pads;
the touch layer includes a first touch electrode and a second touch electrode;
the first touch electrode includes a plurality of first electrode blocks sequentially connected along a first direction;
the second touch electrode includes a plurality of second electrode blocks sequentially connected along a second direction;
the first direction is perpendicular to the second direction;
the touch layer includes a touch pattern layer and a touch bridge layer;
the plurality of first electrode blocks, the plurality of second electrode blocks, and a plurality of first connection portions each connecting adjacent first electrode blocks are disposed on the touch pattern layer;
a plurality of second connection portions each connecting adjacent second electrode blocks are disposed on the touch bridge layer;
the touch pattern layer includes a plurality of metal meshes; and
the at least two second detection segments multiplex the plurality of metal meshes.

2. The display panel according to claim 1, wherein:
an orthographic projection of the at least two second detection segments on the substrate layer does not overlap with an orthographic projection of the first electrode blocks and the second electrode blocks on the substrate layer.

3. The display panel according to claim 1, wherein:
the at least two second detection segments extend along the first direction.

4. The display panel according to claim 1, wherein:
the at least two second detection segments extend along the second direction.

5. The display panel according to claim 1, wherein:
the touch pattern layer further includes dummy electrodes corresponding to the plurality of the first electrode blocks and the second electrode blocks; and
the at least two second detection segments multiplex the dummy electrodes.

6. The display panel according to claim 1, wherein:
the substrate layer includes a plurality of conductive layers; and
the at least one first detection segment and the at least two third detection segments are disposed on a same or different conductive layer of the plurality of conductive layers of the substrate layer.

7. The display panel according to claim 6, wherein:
the plurality of conductive layers of the substrate layer includes a gate electrode layer, a source/drain electrode layer and a storage capacitor layer; and
the at least one first detection segment and/or the at least two third detection segments are disposed on at least one of the gate electrode layer, the source/drain electrode layer, or the storage capacitor layer.

8. The display panel according to claim 1, wherein:
a distance between the first detection segment and an edge of the hole area is equal to or greater than approximately 50 micrometers and smaller than or equal to 100 micrometers.

9. The display panel according to claim 1, wherein:
the detection line of the display panel includes a first detection line and a second detection line insulated from each other; and a distance between a first detection segment of the first detection line and a first detection segment of the second detection line is approximately 50 micrometers.

10. The display panel according to claim 9, wherein:
a distance between the first detection segment of the first detection line and an edge of the hole area is approximately 50 micrometers; and
a distance between the first detection segment of the second detection line and the edge of the hole area is approximately 100 micrometers.

11. The display panel according to claim 1, wherein:
the display panel includes a number N of detection soldering pads, wherein N is equal to or greater than 3;
the detection line includes the number N of second detection segments and the number N of third detection segments;
one end of each of the number N of second detection segments is connected to different positions of one first detection segment; and
another end of the each of the number N of second detection segments is connected to one of the number N of detection soldering pads through one of the number N of third detection segments.

12. A display panel, comprising:
a display area, a bezel area, and a hole area, wherein the bezel area includes an inner bezel area surrounding the hole area and an outer bezel area surrounding the display area, and the display area surrounds the hole area and is disposed between the inner bezel area and the outer bezel area;
a substrate layer, a light-emitting layer, an encapsulation layer and a touch layer, that are sequentially stacked;
at least two detection soldering pads disposed in the outer bezel area; and
a detection line, including at least one first detection segment disposed in the inner bezel area, at least two second detection segments disposed in the display area and at least two third detection segments in outer bezel area,
wherein:
the at least one first detection segment extends along a direction surrounding the hole area;
two ends of a first detection segment of the at least one first detection segment are respectively connected to two different second detection segments of the at least two second detection segments;
a third detection segment of the at least two third detection segments is connected between a second detection segment of the at least two second detection segments and a detection soldering pad of the at least two detection soldering pads;
at least the at least two second detection segments are disposed on the touch layer;
the display area includes a first display area and a second display area at two sides of the hole area;
the at least two detection soldering pads of the display panel includes four detection soldering pads;
the detection line includes two first detection segments, four second detection segments and four third detection segments;
one of the two first detection segments are disposed between the hole area and the first display area;
another of the two first detection segments are disposed between the hole area and the second display area;
two of the four second detection segments are disposed in the first display area; and another two of the four second detection segments are disposed in the second display area.

13. The display panel according to claim 12, wherein:
the outer bezel area includes a bonding area configured to bond one of an integrated circuit chip and a flexible circuit board having an integrated circuit chip;
the bonding area, the display area and the hole area are sequentially disposed along a third direction in parallel with a plane where the display panel is disposed; and
the at least two second detection segments extend along the third direction.

14. The display panel according to claim 12, wherein:
the outer bezel area includes a bonding area configured to bond one of an integrated circuit chip and a flexible circuit board having an integrated circuit chip;
the bonding area, the display area and the hole area are sequentially disposed along a third direction;
the second detection segments extend along a fourth direction;
the fourth direction intersect the third direction; and
the third direction and the fourth direction are both in parallel with a plane where the display panel is disposed.

15. A display apparatus, comprising:
a case; and
a display panel,
wherein the display panel includes:
a display area, a bezel area, and a hole area, wherein the bezel area includes an inner bezel area surrounding the hole area and an outer bezel area surrounding the display area, and the display area surrounds the hole area and is disposed between the inner bezel area and the outer bezel area;
a substrate layer, a light-emitting layer, an encapsulation layer and a touch layer, that are sequentially stacked;
at least two detection soldering pads disposed in the outer bezel area; and
a detection line, including at least one first detection segment disposed in the inner bezel area, at least two second detection segments disposed in the display area and at least two third detection segments in outer bezel area,
wherein:
the at least one first detection segment extends along a direction surrounding the hole area;
two ends of a first detection segment of the at least one first detection segment are respectively connected to two different second detection segments of the at least two second detection segments;
a third detection segment of the at least two third detection segments is connected between a second detection segment of the at least two second detection segments and a detection soldering pad of the at least two detection soldering pads;
the touch layer includes a first touch electrode and a second touch electrode;
the first touch electrode includes a plurality of first electrode blocks sequentially connected along a first direction;
the second touch electrode includes a plurality of second electrode blocks sequentially connected along a second direction;
the first direction is perpendicular to the second direction;
the touch layer includes a touch pattern layer and a touch bridge layer;
the plurality of first electrode blocks, the plurality of second electrode blocks, and a plurality of first connection portions each connecting adjacent first electrode blocks are disposed on the touch pattern layer;
a plurality of second connection portions each connecting adjacent second electrode blocks are disposed on the touch bridge layer;
the touch pattern layer includes a plurality of metal meshes; and
the at least two second detection segments multiplex the plurality of metal meshes.

\* \* \* \* \*